(12) United States Patent
Islam

(10) Patent No.: US 7,295,459 B2
(45) Date of Patent: Nov. 13, 2007

(54) STATIC RANDOM ACCESS MEMORY (SRAM) CELL

(75) Inventor: Mujahid Islam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 30 days.

(21) Appl. No.: 11/201,168

(22) Filed: Aug. 11, 2005

(65) Prior Publication Data

US 2006/0039176 A1 Feb. 23, 2006

(30) Foreign Application Priority Data

Aug. 23, 2004 (GB) ............................ 0418846.2

(51) Int. Cl.
*G11C 11/00* (2006.01)
(52) U.S. Cl. .................. 365/156; 365/154; 365/63
(58) Field of Classification Search ............. 365/156, 365/154, 198, 63
See application file for complete search history.

(56) References Cited

U.S. PATENT DOCUMENTS 5,301,146 A * 4/1994 Hama .................... 365/154
6,058,041 A * 5/2000 Golke et al. ............ 365/156
6,097,664 A * 8/2000 Nguyen et al. ....... 365/230.05
6,275,080 B1 * 8/2001 Phan et al. ............. 327/200
6,549,443 B1 * 4/2003 Jensen et al. ............ 365/56

FOREIGN PATENT DOCUMENTS

| GB | 2 360 113 A | 9/2001 |
| JP | 4-298893 A | 10/1992 |
| JP | 2001-283588 A | 10/2001 |
| WO | WO 03/085673 A2 | 10/2003 |

* cited by examiner

Primary Examiner—Gene N. Auduong
(74) Attorney, Agent, or Firm—Oliff & Berridge, PLC

(57) ABSTRACT

An SRAM memory cell employing thin-film transistors is provided having a first transmission gate, a second transmission gate and a bi-stable flip-flop comprising a first and a second inverter disposed between the first and the second transmission gate. A third transmission gate is coupled between an output terminal of the second inverter and an input terminal of the first inverter.

17 Claims, 4 Drawing Sheets

STATIC RANDOM ACCESS MEMORY (SRAM) CELL

The present invention relates, in general, to a Memory Cell of a type known as a Static Random Access Memory (SRAM) Cell. The present invention is particularly applicable to an SRAM cell employing thin-film transistors.

Computer memory is commonly provided for by an array of memory cells. Each memory cell can be placed in one of two states to represent a single bit of data. The data, which is in the form of a data logic 1 or 0, can be stored in the memory cell, read from the memory cell and written to the memory cell as required.

One class of memory that is commonly used to temporarily store data is known as a Static Random Access Memory (SRAM). SRAM is a cache system that is typically used to provide a direct, high-speed interface with a Central Processing Unit (CPU). SRAM comprises a matrix of cells each addressed by word and bit lines. Within each SRAM cell, a bi-stable flip-flop is provided that can be held in a state representing the data logic 1 or 0. As long as power is supplied to the SRAM cell, the flip-flop can be held in the state representing the data logic 1 or 0 indefinitely.

At least three types of SRAM cells are known. Referring to FIG. 1, a six-transistor (6T) SRAM cell 10 comprises a first NMOS transistor 12 and a second NMOS transistor 14 each having a gate terminal connected to a word line wl. The first NMOS transistor 12 and the second NMOS transistor 14 are typically referred to as access transistors 12, 14. The access transistor 12 provides access to a second CMOS flip-flop inverter 18 from a first bit column b1 and also access to the first bit column b1 from a first CMOS flip-flop inverter 16. The access transistor 14 provides access to the first CMOS flip-flop inverter 16 from a second bit column b1bar and also access to the second bit column b1bar from the second CMOS flip-flop inverter 18. One NMOS transistor 20 and one PMOS transistor 22 are provided for each inverter 16, 18. A sense amplifier (a voltage comparator) is provided (not shown in FIG. 1) across the first and the second bit lines b1, b1bar.

A second type of SRAM cell is known as a four-transistor two-resistor (4T2R) SRAM cell. Referring to FIG. 2, in a 4T2R SRAM cell 30 the PMOS transistors 22 of the 6T SRAM cell 10 of FIG. 1 are replaced by resistors 32. A third type of SRAM cell is known simply as a four-transistor (4T) SRAM cell. Referring to FIG. 3, in a 4T SRAM cell 40, the PMOS transistors 22 of the 6T SRAM cell 10 of FIG. 1 and the resistors 32 of the 4T2R SRAM cell 30 of FIG. 2 are removed.

A data logic 1 or 0 is held in the SRAM cell 10, 30 by applying a voltage $V_{cc}$ across the first and the second inverters 16, 18 to power them. In the case of the SRAM cell 40, the data logic 1 or 0 is stored by leakage current through the access transistors 12, 14 with an appropriate voltage generated across the first and second bit columns b1, b1bar.

During read and write operations of the SRAM cell 10, 30 or 40, a signal is applied to the appropriate word line wl. This switches "on" the access transistors 12, 14 in order that the first and second inverters 16, 18 can be addressed by the first bit column b1 and the second bit column b1bar respectively.

During a read operation, the first bit column b1 and the second bit column b1bar are connected across the sense amplifier which determines, by comparing the signal on the first bit column b1 with the signal on the second bit column b1bar, whether a data logic 1 or 0 is held in the SRAM cell 10, 30, 40. The first bit column b1 and the second bit column b1bar can be long and comprise a high capacitance necessitating a need for the NMOS transistors 20 to have a high driving power. The sense amplifier communicates the determined logic state to an output buffer.

During a write operation, new data, which is in the form of a data logic 1 or 0, is written into the SRAM cell 10, 30, 40 by a write driver (not shown). In order to write, the write driver must overcome the amplitude of the data previously stored in the SRAM cells 10, 30, 40 to force the new data logic state into the SRAM cell 10, 30, 40. The signal amplitude held in the inverters 16, 18 can be high because it is necessary to employ inverters 16, 18 with a high driving power to provide a strong signal to the sense amplifier in a read operation. Additionally, the write circuitry must overcome any impedance of the access transistors 12, 14.

The 4T SRAM cell 40 has a smaller cell area than the 4TR SRAM cell 30, which in turn has a smaller area than the 6T SRAM cell 10. As the cell area is reduced, an increased memory density per chip can be realised. However, the increased memory density gained by the 4T SRAM cell 40 and the 4TR SRAM cell 30 over the 6T SRAM cell 10 comes at a cost of increased static current, reduced noise immunity, reduced soft error immunity and increased access time compared to the 6T SRAM cell 10.

It is desirable to manufacture an SRAM cell using Thin-Film Transistor (TFT) technology because of the low manufacturing overheads associated with TFTs. However, a number of problems are associated with TFT technology, which have mitigated their exploitation in SRAM cells. TFTs have a comparatively low driving power compared to the CMOS SRAM cells described above. Moreover, individual TFTs typically have varying threshold voltages from neighbouring TFTs and therefore construction of an SRAM cell employing TFTs is typically subject to a difficult simulation process which cannot guarantee correct functionality across all the variations.

More specifically, the prior art 6T cell discussed above relies on the careful sizing of transistors to ensure that a new value can be overwritten into the cell via a single access transistor by forcing the node voltage of the first inverter against the output of the second inverter in the cell. The inverters also need to be able to drive the bit lines, whilst keeping the capacitance of the bit lines as low as possible. Thus, there is a conflict between the requirements that the cell can be easily written and that transistors are as small sized as possible and the requirement that the transistors in the inverters be large enough to allow sufficient driving power to drive the bit lines for accurate reading. This conflict is very difficult to resolve with the parameter variations observed for TFTs.

A known sense amplifier for reading memory cells is shown in FIG. 6. The sense amplifier comprises five transistors. More specifically, the sense amplifier comprises first and second input transistors t1 and t2 connected in first and second parallel limbs respectively, which are provided between a power supply Vdd and earth (or another suitable voltage). The gates of the two input transistors t1 and t2 are connected to the first and second bit columns b1 and b1bar respectively. Thus, input transistor t1 receives an input Vin1 from the first bit column b1 and input transistor t2 receives an input Vin1 from the second bit column b1bar.

As shown, a current mirror transistor t3 is connected in series on one limb between the power supply Vdd and one of the input transistors t1. Similarly, another current mirror transistor t4 is connected in series on the other limb between the power supply Vdd and the other input transistor t2. To form the current mirror, one of the current mirror transistors t3 is diode-connected, by connecting its drain and gate, and the gates of the current mirror transistors t3 and t4 are also connected. A reference transistor t5 is connected in series between both input transistors t1 and t2 in the respective limbs and earth (or the other suitable voltage). The gate of the reference transistor t5 is connected to a reference voltage Vref. Finally, an output Vout is taken from between the current mirror transistor t4 that is not diode-connected and the input transistor t2 connected in series with it in the same limb.

The data is output from the prior art 6T cell via the bit line and its complement as a differential signal Vin1−Vin2 driven by the small transistors of the cell. The sense amplifier senses this differential signal, which is a relatively small signal. Depending on the value of the differential signal Vin1−Vin2, a signal Vout indicating that either a digital 1 or digital 0 is stored in the cell is taken from the output of the sense amplifier.

However, for accurate reading of the memory cell, good transistor matching is essential. In particular, current mirror transistors t3 and t4 must be accurately matched and input transistors t1 and t2 must be accurately matched. In view of this requirement and the large parameter variations observed for TFTs, the sense amplifier has hitherto needed to be manufactured using CMOS transistors for consistent and accurate sensing of the small differential signals.

One solution is to provide an SRAM using large TFTs in order to obtain a high driving power and therefore a strong output signal that can be readily detected by a sense amplifier. However, employing large TFTs has the disadvantage that in a write operation the write driver must fight against the high signal amplitude in the SRAM cell. Moreover, the memory density achievable is reduced considerably.

Research towards improvements in SRAM cells is therefore focused upon improving CMOS SRAM cells. In particular, research is directed towards reducing the cell area whilst trying to minimise the effect on performance characteristics such as access time and immunity to noise and soft error.

According to a first aspect of the present invention, there is provided a memory cell comprising:
first and second data lines;
a bi-stable flip flop between the first and second data lines, the bi-stable flip-flop comprising a first and a second inverter, the first inverter having an input from the first data line and the second inverter having an output to the second data line;
a first addressable transmission gate coupled between the first inverter and the first data line;
a second addressable transmission gate coupled between the second inverter and the second data line; and
a third addressable transmission gate coupled between the output of the second inverter and the input of the first inverter for controlling feedback between the first and second inverters.

Preferably, the first and third addressable transmission gates are addressable by means of a first addressing line and the third addressable transmission gate is addressable by means of a second addressing line. More preferably, the first data line is a data write line, the second data line is a data read line, the first addressing line is a word write line and the second addressing line is a word read line.

Preferably, at least one transmission gate comprises a transistor. Preferably, the at least one transmission gate comprises two transistors of opposite channel type. Preferably, the two transistors of opposite channel type are arranged to be addressed by complementary differential signals whereby the two transistors of opposite channel type are both opened or both closed. Most preferably, at least one transistor is a thin-film transistor.

Preferably, the first inverter is a smaller size than the second inverter. Preferably, the first and the second inverters each comprise an n-channel thin-film transistor and a p-channel thin-film transistor, the first and the second inverters being in a cross-coupled configuration.

According to a further aspect of the present invention, there is provided a memory device comprising one or more memory cells as described above. Preferably, the memory device further comprises a sense amplifier for determining a logic state of the one or more memory cells. Preferably, the sense amplifier comprises thin-film transistors.

The present invention therefore provides a SRAM cell that can employ thin-film transistors. The SRAM cell of the present invention experiences less static current, increased noise immunity, increased soft error immunity and decreased access time compared to known SRAM cells employing thin-film transistors. In contrast to the direction of research presently pursued in the art, the SRAM cell according to the present invention actually increases the number of transistors used in the SRAM cell. Gains in efficacy of the SRAM cell and reductions in manufacturing costs and flexibility make such an increase in numbers beneficial. Since the writing and reading inverters of the bi-stable flip-flop of the present invention can be isolated from one another by way of feedback control, the first inverter can be manufactured for gains in efficiency of writing and the second inverter can be manufactured for gains in efficiency for reading. The sense amplifier of the present invention need not sense the difference between a bit line and a differential bit line since these lines are advantageously removed.

Embodiments of the present invention will now be described by way of further example only and with reference to the accompanying drawings, in which.

Throughout the following description like reference numerals shall be used to identify like parts.

Figure 4:
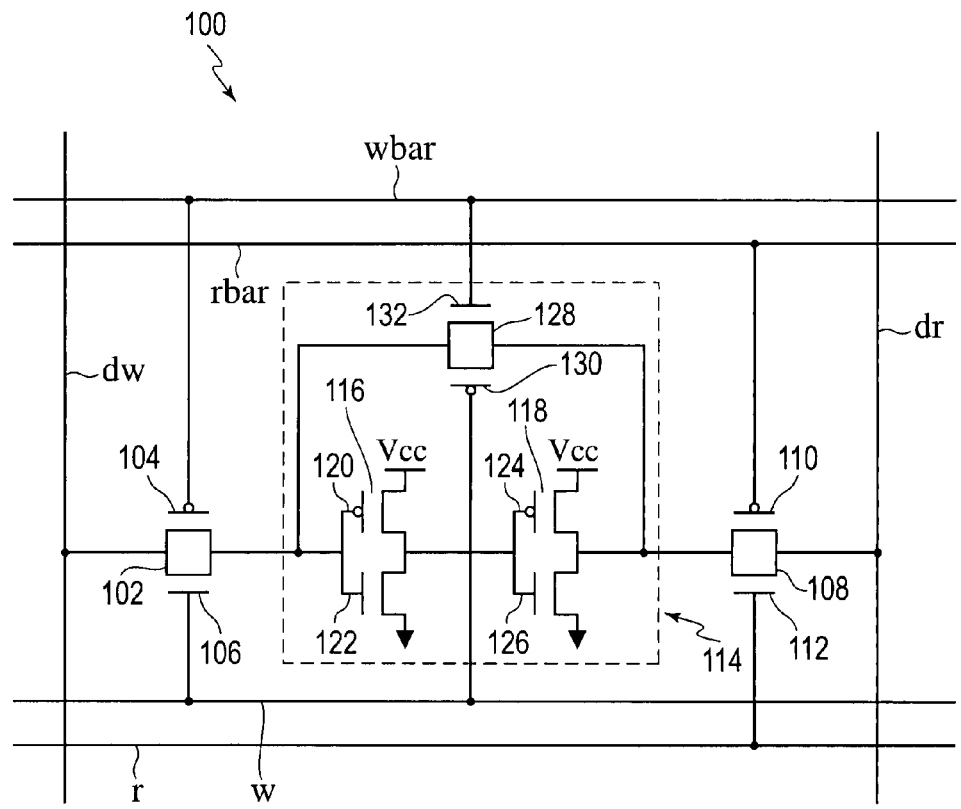
FIG. 4 is a schematic diagram of a memory cell according to a first embodiment of the present invention.

Referring to FIG. 4, a ten Thin-Film Transistor Static Random Access Memory (10 TFT SRAM) cell 100 according to the present invention comprises a first transmission gate 102 comprising a first p-channel TFT 104 and a first n-channel TFT 106. A gate terminal of the first n-channel TFT 106 is coupled to a first write line w for receiving a write signal. A gate terminal of the first p-channel TFT 104 is coupled to a second write line wbar for receiving a corresponding differential write signal. A first terminal of the first p-channel TFT 104 and a first terminal of the first n-channel TFT 106 are coupled to a data write line dw.

A second transmission gate 108 comprises a second p-channel TFT 110 and a second n-channel TFT 112. A gate terminal of the second n-channel TFT 112 is coupled to a first read line r for providing a read signal. A gate terminal of the second p-channel TFT 110 is coupled to a second read line rbar for providing a corresponding differential read signal. A first terminal of the second p-channel TFT 110 and a first terminal of the second n-channel TFT 112 are coupled to a data read line dr.

The first p-channel TFT 104, first n-channel TFT 106, second p-channel TFT 110 and second n-channel TFT 112 are known as access transistors.

Within the 10 TFT SRAM cell 100, a bi-stable flip-flop 114 comprises a first inverter 116 coupled to a second inverter 118. The first inverter 116 comprises a third p-channel TFT 120 and a third n-channel TFT 122. The second inverter 118 comprises a fourth p-channel TFT 124 and a fourth n-channel TFT 126. The first inverter 116 and the second inverter 118 are cross-coupled inverters as is known in the art. An input of the first inverter 116 is coupled to a second terminal of the first p-channel TFT 104 and a second terminal of the first n-channel TFT 106. An output of the second inverter 118 is coupled to a second terminal of the second p-channel TFT 110 and a second terminal of the second n-channel TFT 112.

A third transmission gate 128 is coupled between the output of the second inverter and the input of the first inverter. The third transmission gate 128 is therefore arranged in a feedback manner between the output of the second inverter 118 and the input of the first inverter 116. The third transmission gate 128 comprises a fifth p-channel TFT 130 and a fifth n-channel TFT 132. A gate terminal of the fifth p-channel TFT 130 is coupled to the first write line w, and a gate terminal of the fifth n-channel TFT 132 is coupled to the second write line wbar. A first terminal of the fifth p-channel TFT 130 and a first terminal of the fifth n-channel TFT 132 are coupled to the output of the second inverter 118. A second terminal of the fifth p-channel TFT 130 and a second terminal of the fifth n-channel TFT 132 is coupled to the input of the first inverter 116.

During a storage operation, a voltage Vcc is applied across the first inverter 116 and the second inverter 118. A "low" signal is applied to the gate terminal of the first n-channel TFT 106 from the first write line w and a corresponding differential "high" signal is applied to the gate terminal of the first p-channel TFT 104 from the second write line wbar. The "low" signal is also therefore applied to the gate terminal of the fifth p-channel transistor 130 and the "high" signal is therefore also applied to the fifth n-channel transistor 132 of the third transmission gate 128 arranged in a feedback manner. As a result, the first transmission gate 102 is switched to an OFF state and the third transmission gate is switched to an ON state. As long as the voltage supply Vcc is maintained at a suitable level, the bi-stable flip-flop 114 stores the data indefinitely.

In a write operation, a "high" signal is applied to the gate terminal of the first n-channel TFT 106 from the first write line w and a corresponding differential "low" signal is applied to the gate terminal of the first p-channel TFT 104 from the second write line wbar. The "high" signal is also therefore applied to the gate terminal of the fifth p-channel transistor 130 and the "low" signal is therefore also applied to the fifth n-channel transistor 132 of the third transmission gate 128 arranged in a feedback manner. As a result, the first transmission gate 102 is switched to an ON state and the third transmission gate 128 is switched to an OFF state.

Data in the form of a data logic 1 or 0 is applied to the first inverter 116 of the bi-stable flip-flop 114 from the data write line dw by way of the first transmission gate 102. When writing into the bi-stable flip-flop 114 feedback from the second inverter 118 is disconnected. The ability to write data into the bi-stable flip-flop 114 is primarily governed by the characteristics of the first inverter 116 and the first transmission gate 102. The first inverter 116 can therefore be manufactured as small as possible to enable ease of writing. Thus, the load on the data write line can be lowered accordingly thereby reducing power consumption.

In a read operation, the first transmission gate 102 remains OFF. A "high" signal is applied to the gate terminal of the second n-channel TFT 112 from the first read line r and a "low" signal is applied to the gate terminal of the second p-channel TFT 110 in order to switch the second transmission gate 108 ON. A sense amplifier (not shown), which may also advantageously comprise TFTs, can determine the logic state of the bi-stable flip-flop 114 by way of the data read line dr by comparing a measured signal on the data read line dr with a threshold level that defines the boundary between a data logic 1 and 0.

It is possible to perform a write and a read operation simultaneously. In this embodiment, a "high" signal is applied to the gate terminal of the first n-channel TFT 106 from the first write line w and a corresponding differential "low" signal is applied to the gate terminal of the first p-channel TFT 104 from the second write line wbar. The "high" signal is also therefore applied to the gate terminal of the fifth p-channel transistor 130 and the "low" signal is therefore also applied to the fifth n-channel transistor 132 of the third transmission gate 128 arranged in a feedback manner. As a result, the first transmission gate 102 is switched to an ON state and the third transmission gate 128 is switched to an OFF state. Simultaneously, a "high" signal is applied to the gate terminal of the second n-channel TFT 112 from the first read line r and a "low" signal is applied to the gate terminal of the second p-channel TFT 110 in order to switch the second transmission gate 108 ON.

As such, both the first transmission gate 102 and the second transmission gate 108 are ON. Therefore, in operation, data in the form of a data logic 1 or 0 is applied to the first inverter 116 of the bi-stable flip-flop 114 from the data write line dw by way of the first transmission gate 102 and placed onto the data read line dr by the first and second inverters 116, 118 by way of the second transmission gate 108. In this embodiment, the output can be delayed compared to the input and the output value can therefore change to a new value whilst being read.

Figure 6:
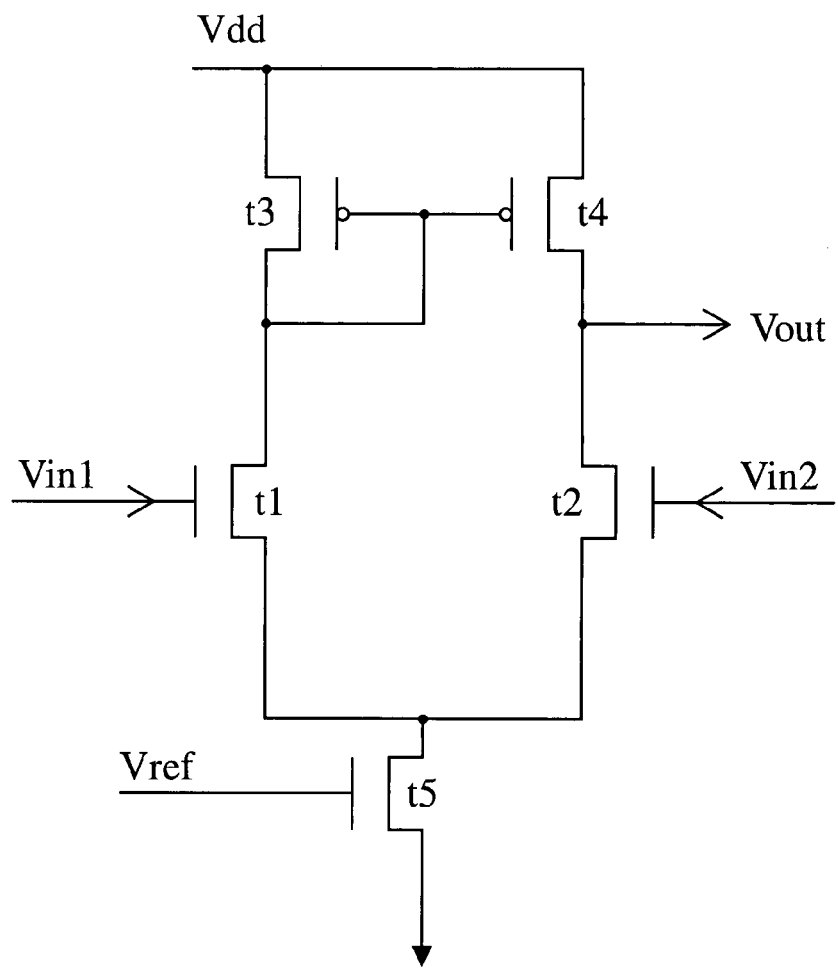
FIG. 6 is a schematic diagram of a known sense amplifier.

Since the primary effect governing the ability to read data from the bi-stable flip-flop 114 is the driving power characteristic of the second inverter 118, the second inverter 118 is manufactured with enough driving power that the data read line dr reaches sufficient voltage levels for consistently accurate comparison with a threshold voltage. Consequently, the known architecture for sense amplifiers shown in FIG. 6 need not be used unless desired. Thus, accurate transistor matching in the sense amplifier is no longer as important a consideration. Instead, a TFT sense amplifier can consistently and accurately detect the state of the bi-stable flip-flop by comparing the output of the second inverter with a threshold voltage.

Using two TFT transistors of different channel types for each transmission gate as described above is advantageous because a p-channel TFT passes a "high" signal more efficiently than a "low" signal. In contrast, an n-channel transistor passes a "low" signal more efficiently than a "high" signal. For example, if the second inverter 118 outputs a "high" signal, then it will be passed more efficiently by the p-channel TFT 110 in the transmission gate 108 and if the second inverter 118 passes a "low" signal, it will be passed better by the n-channel TFT 112 in the transmission gate 108. Consequently, lower voltage levels can be used for reading than if only a single transistor were used for the transmission gate, without sacrificing the accuracy of the read data. Similar considerations apply in the use of two transistors for the other transmission gates 104, 128.

Figure 5:
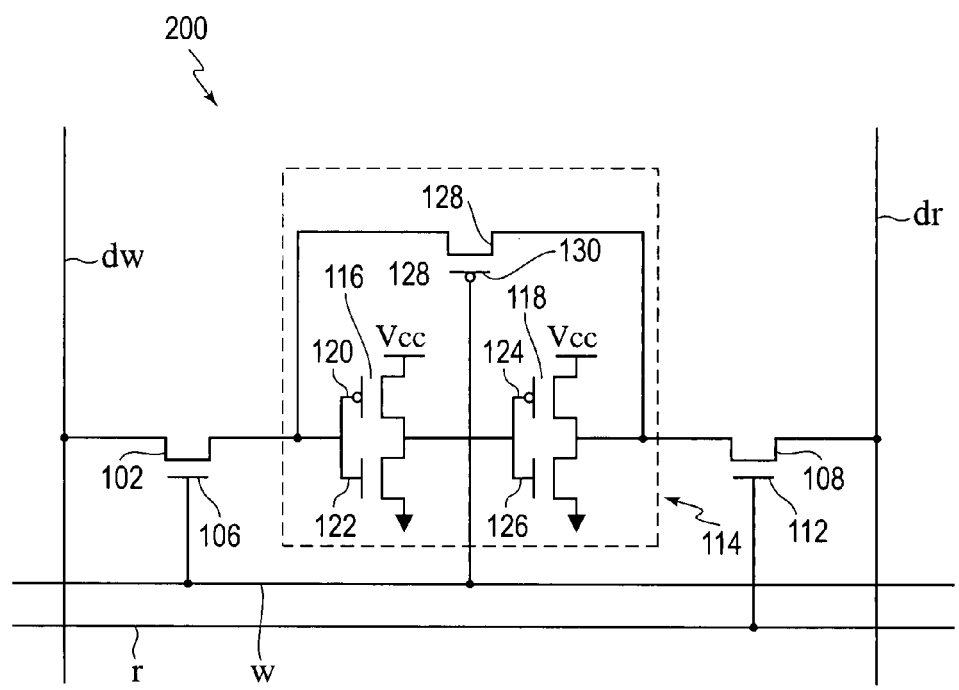
FIG. 5 is a schematic diagram of a memory cell according to a second embodiment of the present invention.

However, the present invention can also be realised using single transistor transmission gates if desired. Referring to FIG. 5, a 7 TFT SRAM cell 200 according to a second embodiment of the present invention comprises all the components of the 10 TFT SRAM cell 100 described with reference to FIG. 4 but with the removal of the second write and second read lines wbar, rbar, the first p-channel TFT 104, the second p-channel TFT 110 and the fifth n-channel TFT 132.

During a storage operation, a voltage Vcc is applied across the first inverter 16 and the second inverter 18. A "low" signal is applied to the gate terminal of the first n-channel TFT 106 from the first write line w. The "low" signal is also therefore applied to the gate terminal of the fifth p-channel transistor 130 of the third transmission gate 128 arranged in a feedback manner. As a result, the first transmission gate 102 is switched to an OFF state and the third transmission gate is switched to an ON state. As long as the voltage supply $V_{CC}$ is maintained at a suitable level, the bi-stable flip-flop 114 stores the data indefinitely.

In a write operation, a "high" signal is applied to the gate terminal of the first n-channel TFT 106 from the first write line w. The "high" signal is also therefore applied to the gate terminal of the fifth p-channel transistor 130 of the third transmission gate 128 arranged in a feedback manner. As a result, the first transmission gate 102 is switched to an ON state and the third transmission gate is switched to an OFF state.

In a read operation, the first transmission gate 102 remains OFF and the operation proceeds as described above with reference to FIG. 4.

If the second embodiment is employed, it is advantageous to skew the third p-channel TFT 120 and the third n-channel TFT 122 of the first inverter 116 so that the first inverter 116 can recognise a "high" signal that is of comparatively low amplitude due to the poor pass characteristics of the n-channel transistor 106 when passing a "high" signal.

In the second embodiment, the second write and second read lines wbar, rbar, the first p-channel TFT 104, the second p-channel TFT 110 and the fifth n-channel TFT 132 have all been removed. Alternatively, the first write and second read lines w, r, the n-channel TFT 106, the n-channel TFT 112 and the fifth p-channel TFT 130 could have been removed. Indeed, any suitable combination of channel types of transistors and addressing lines could be used, so long as the desired effect can be obtained. The cell area is reduced by choosing opposite polarity of transistors for the first transmission gate 102 and the third transmission gate 128. Such an arrangement allows a single addressing line, w or wbar, to be used.

The second embodiment has the advantages of a reduction in cell size due to the reduction in transistor count and, in particular, the removal of two signal lines from each row of the layout. However, it has the disadvantage of a lack of good voltage signals through the single transistor transmission gates.

Figure 1:
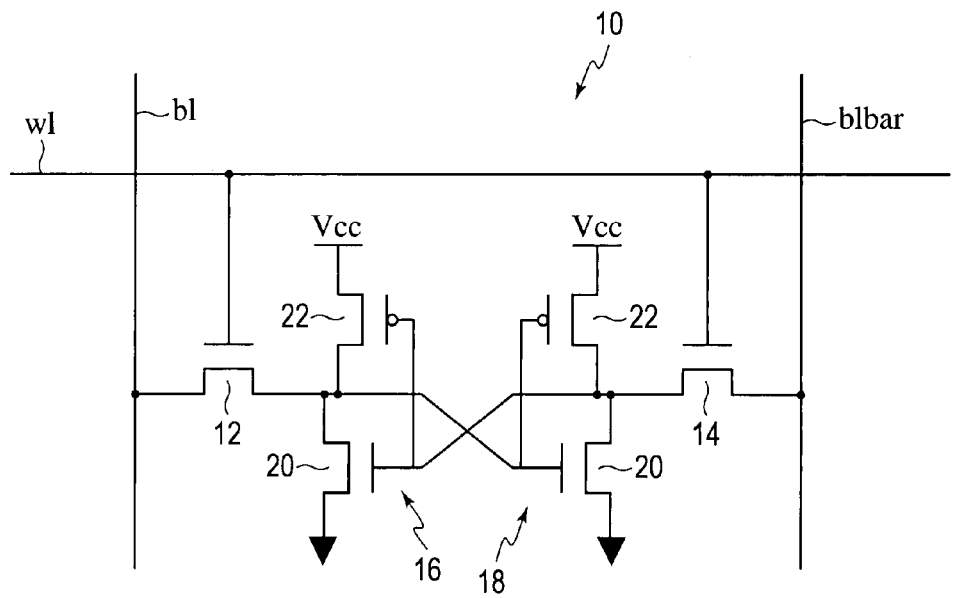
FIG. 1 is a schematic diagram of a known 6T SRAM cell.
Figure 2:
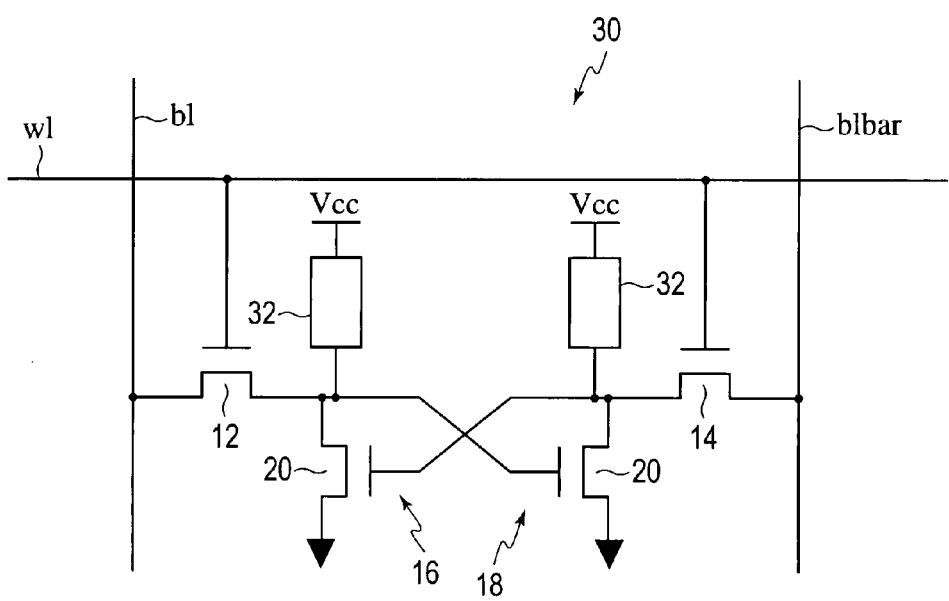
FIG. 2 is a schematic diagram of a known 4T2R SRAM cell.
Figure 3:
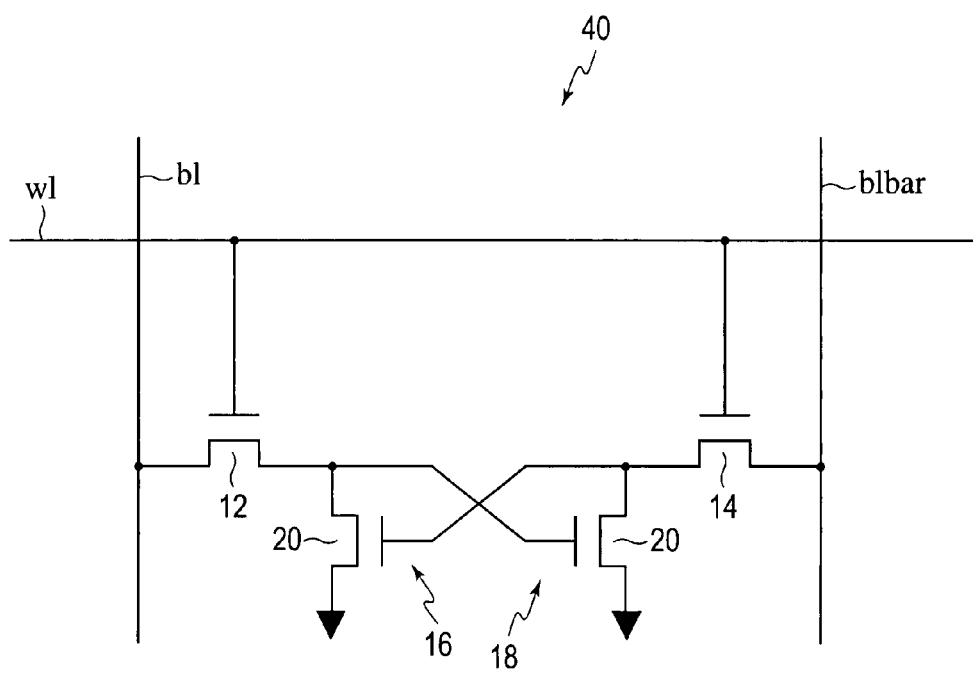
FIG. 3 is a schematic diagram of a known 4T SRAM cell.

In addition, all embodiments of the present invention thus far described use the bi-stable flip-flop architecture of the known 6T cell shown in FIG. 1, with a transmission gate in the feedback loop between the second and first inverters. However, any other suitable bi-stable flip-flop architecture could be used, such as those shown in FIGS. 2 and 3, so long as a transmission gate can be included to control the feedback between the inverters.

It is noted that in all the embodiments hitherto described, the third transmission gate is addressed using the write line(s). However, this transmission gate could be separately addressed using another line, if desired.

The benefits of the present invention include that an all TFT memory cell and sense amplifier can be provided without sacrificing accuracy. Thus, memory devices according to the present invention can be more easily and flexibly designed, as well as reliably, cheaply and easily manufactured.

However, whilst the above embodiments have been described with and are particularly advantageous employing thin-film transistors, it should be appreciated by those skilled in the art that any suitable switching device or combination of switching devices could be employed.

The aforegoing description has been given by way of example only and it will be appreciated by a person skilled in the art that modifications can be made without departing from the scope of the present invention.

The invention claimed is:

1. A memory cell comprising:
    a first data line;
    a second data line;
    a first write line that transmits a first write signal;
    a second write line that transmits a second write signal;
    a first read line that transmits a first read signal;
    a second read line that transmits a second read signal;
    a bi-stable flip flop between the first data line and second data line, the bi-stable flip-flop including a first and a second inverter, the first inverter having an input from the first data line, and the second inverter having an output to the second data line;
    a first addressable transmission gate coupled between the first inverter and the first data line, the first addressable transmission gate being controlled by the first write signal and the second write signal;
    a second addressable transmission gate coupled between the second inverter and the second data line, the second addressable transmission gate being controlled by the first read signal and the second read signal; and
    a third addressable transmission gate coupled between the output of the second inverter and the input of the first inverter that controls feedback between the first inverter and the second inverter.

2. The memory cell according to claim 1, the third addressable transmission gate being controlled by the first write signal and the second write signal.

3. The memory cell according to claim 1, wherein the first data line and the second data line are a data write line and a data read line, respectively.

4. The memory cell according to claim 1, wherein at least one of the first addressable transmission gate, the second addressable transmission gate, and the third addressable transmission gate includes a transistor.

5. The memory cell according to claim 1, wherein the at least one of the first addressable transmission gate, the second addressable transmission gate and third addressable transmission gate includes two transistors whose channel types are different from each other.

6. The memory cell according to claim 5, wherein the two transistors are both opened or both closed.

7. The memory cell according to claim 4, wherein the transistor is a thin-film transistor.

8. A memory cell according to claim 1, wherein the first inverter having a size smaller than the second size of the inverter.

9. The memory cell according to claim 1, wherein each of the first inverter and the second inverter includes an n-channel thin-film transistor and a p-channel thin-film transistor, and the first and the second inverter are in a cross-coupled configuration.

10. A memory device comprising at least one memory cell according to claim 1.

11. The memory device according to claim 10, further comprising a sense amplifier that determines a logic state of at least one memory cell.

12. The memory device as claimed in claim 11, wherein the sense amplifier includes thin-film transistors.

13. The memory cell according to claim 5, wherein the two transistors includes at least one thin-film transistor.

14. A memory cell comprising:
- a first data line;
- a second data line;
- a bi-stable flip flop between the first data line and the second data lines, the bi-stable flip-flop including a first inverter and a second inverter, the first inverter having an input from the first data line, and the second inverter having an output to the second data line;
- a first addressable transmission gate coupled between the first inverter and the first data line;
- a second addressable transmission gate coupled between the second inverter and the second data line; and
- a third addressable transmission gate coupled between the output of the second inverter and the input of the first inverter that controls feedback between the first inverter and the second inverter,
- at least one of the first addressable transmission gate, the second addressable transmission gate and the third addressable transmission gate including two transistors whose channel types are different from each other, and
- the two transistors being both opened or both closed.

15. The memory cell according to claim 14, further comprising:
- a first write line that transmits a first write signal;
- a second write line that transmits a second write signal;
- a first read line that transmits a first read signal; and
- a second read line a second read signal,
- the first addressable transmission gate being controlled by the first write signal and the second write signal, and
- the second addressable transmission gate being controlled by the first read signal and the second read signal.

16. The memory cell according to claim 15,
the third addressable transmission gate being controlled by the first write signal and the second write signal.

17. The memory cell according to claim 14,
at least one of the first addressable transmission gate, the second addressable transmission gate and the third addressable transmission gate including a transistor.

* * * * *